US012669553B2

(12) United States Patent
Jang et al.

(10) Patent No.: US 12,669,553 B2
(45) Date of Patent: Jun. 30, 2026

(54) BIG-DATA-BASED BATTERY DIAGNOSTIC SYSTEM AND CONTROL METHOD THEREFOR

(71) Applicants: Hyundai Motor Company, Seoul (KR); Kia Corporation, Seoul (KR)

(72) Inventors: Hyun Jun Jang, Daegu (KR); Byung Soo Park, Daejeon (KR); Woo Sung Kim, Suwon-si (KR); Jae Shin Yi, Seoul (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 298 days.

(21) Appl. No.: 17/821,597

(22) Filed: Aug. 23, 2022

(65) Prior Publication Data

US 2023/0133120 A1     May 4, 2023

(30) Foreign Application Priority Data

Oct. 28, 2021     (KR) ........................ 10-2021-0145432

(51) Int. Cl.
| | |
|---|---|
| *G01R 31/396* | (2019.01) |
| *B60L 3/00* | (2019.01) |
| *G07C 5/08* | (2006.01) |

(52) U.S. Cl.
CPC .......... *G01R 31/396* (2019.01); *B60L 3/0046* (2013.01); *G07C 5/0808* (2013.01)

(58) Field of Classification Search
None
See application file for complete search history.

(56) References Cited

U.S. PATENT DOCUMENTS

2016/0140779 A1 * 5/2016 Takenaka ............... G07C 5/008
                                                            701/29.1
2016/0308259 A1 * 10/2016 Eifert .................. H01M 10/486
                        (Continued)

FOREIGN PATENT DOCUMENTS

WO     WO-2012081883 A2 * 6/2012     ............... B60Q 5/00
WO     WO-2019042412 A1 * 3/2019     ............... H02J 7/00

OTHER PUBLICATIONS

Office Action for Korean Application 10-2021-0145432, dated May 29, 2025.

*Primary Examiner* — Matthew G Marini
(74) *Attorney, Agent, or Firm* — MCDONNELL BOEHNEN HULBERT & BERGHOFF LLP

(57)     ABSTRACT

Disclosed herein is a big-data-based battery diagnostic system that includes a first vehicle having a first battery module disposed therein, a battery data server having a processor configured to collect first state information related to the first battery module provided from the first vehicle, to learn the collected first state information, and to set a reference voltage for the first vehicle based on the learned first state information, and a second vehicle configured to receive the reference voltage from the battery data server and having a second battery module disposed therein. The second vehicle is configured to measure second state information related to the second battery module, compare the measured second state information with the reference voltage to analyze the same, and apply a result value of the comparison and analysis to a preset diagnostic level range to diagnose a current state of the second vehicle.

19 Claims, 8 Drawing Sheets

(56)          References Cited

U.S. PATENT DOCUMENTS

| 2018/0095140 A1* | 4/2018 | Park | G01R 31/367 |
| 2020/0111272 A1* | 4/2020 | Ferre Fabregas | G05B 23/0283 |
| 2020/0244089 A1* | 7/2020 | Nishida | G01R 31/367 |
| 2020/0271725 A1* | 8/2020 | Herring | B60L 58/12 |
| 2021/0325833 A1 | 10/2021 | Park | |

* cited by examiner

BIG-DATA-BASED BATTERY DIAGNOSTIC SYSTEM AND CONTROL METHOD THEREFOR

CROSS-REFERENCE TO RELATED APPLICATIONS

This application claims the benefit of Korean Patent Application No. 10-2021-0145432, filed on Oct. 28, 2021, which is hereby incorporated by reference as if fully set forth herein.

TECHNICAL FIELD

The present disclosure relates to a big-data-based battery diagnostic system capable of performing battery cell safety diagnosis in all situations occurring in an actual field by utilizing big data collected from mass-produced vehicles, and a control method therefor.

BACKGROUND

With the recent increase in interest in the environment, a number of hybrid electric vehicles (HEVs) or electric vehicles (EVs) using electric motors as driving sources have been developed.

In these xEVs, battery packs are often used as power sources, and battery ignition and stability issues have a significant influence on customers' purchase decisions.

In order to increase market share in the xEV market, there has emerged a need for battery safety diagnostic technology that is differentiated from other companies and is consistent.

The formula-based battery cell safety diagnostic method built into a conventional battery management system (BMS) (control unit) is a method that is passive and made only on the basis of physical formulas/a few tests. Hence, there may be many issues and discrepancies that occur in actual field vehicles.

In addition, the electrochemical characteristics of a battery are greatly affected by temperature, and it is difficult to control the battery only with battery modeling due to the amount of heat generated during charging, the temperature of the surrounding environment, and the change in temperature due to cooling systems.

For example, depending on the region and country in which the vehicle is driven (for example, South America in an extremely high temperature region/Cryogenic region), the degree of deterioration of the battery cell and the state estimation result thereof vary even when the vehicle is operated under the same load.

Although conventional battery modeling methodologies have an advantage of estimating the voltage at room temperature at a cell-based basis, they have a disadvantage of a one-cell basis and a limitation in that they do not reflect the actual state of the bus bar resistance, the electric load, and the BSA at all.

In addition, considering the amount of BMS calculation, a methodology capable of performing calculation at the level of vehicle control unit H/W includes electrical modeling through extremely simplified circuit analysis. This method is a simple calculation method because it interprets the battery state estimation based on the electrical circuit. However, it has a disadvantage in that the accuracy of the state estimation is poor because the model is simple.

Meanwhile, the conventional method cannot mass-produce all battery cells by testing, modeling, and verifying them since the battery cells are modeled with a certain number of battery cells and packs and 300 or more battery cells are included in each NE EV standard vehicle in reality.

SUMMARY

Accordingly, the present disclosure is directed to a big-data-based battery diagnostic system and a control method therefor that substantially obviate one or more problems due to limitations and disadvantages of the related art.

An object of the present disclosure is to provide a big-data-based battery diagnostic system capable of securing consistency of safety diagnosis of battery cells by learning big data from hundreds to tens of thousands of mass-produced vehicles to estimate how much a current vehicle deviates from its normal state compared to the reference that is set through tens of thousands of other vehicles, and a control method therefor.

Another object of the present disclosure is to provide a big-data-based battery diagnostic system capable of performing battery safety diagnosis to be customized according to the condition of each vehicle by utilizing big data collected from mass-produced vehicles, and a control method therefor.

The present disclosure is not limited to the above-mentioned objects, and other objects of the present disclosure can be clearly understood by those skilled in the art to which the present disclosure pertains from the following description.

Additional advantages, objects, and features of the present disclosure will be set forth in part in the description which follows and in part will become apparent to those having ordinary skill in the art upon examination of the following or may be learned from practice of the present disclosure. The objectives and other advantages of the present disclosure may be realized and attained by the structure particularly pointed out in the written description and claims hereof as well as the appended drawings.

To achieve these objects and other advantages and in accordance with the purpose of the present disclosure, as embodied and broadly described herein, there is provided a method of controlling a big-data-based battery diagnostic system having a battery data server, which includes collecting first state information related to a first battery module from a first vehicle having the first battery module disposed therein, learning the collected first state information and setting a reference voltage for the first vehicle based on the learned first state information, providing the reference voltage to a second vehicle having a second battery module disposed therein, measuring second state information related to the second battery module, and comparing the measured second state information with the reference voltage to analyze the same, and diagnosing a current state of the second vehicle by applying a result value of the comparison and analysis to a preset diagnostic level range.

In accordance with another aspect of the present disclosure, there is provided a battery diagnostic system based on big data, which includes a first vehicle having a first battery module disposed therein, a battery data server having a processor configured to collect first state information related to the first battery module provided from the first vehicle, to learn the collected first state information, and to set a reference voltage for the first vehicle based on the learned first state information, and a second vehicle configured to receive the reference voltage from the battery data server and having a second battery module disposed therein. The second vehicle is configured to measure second state information related to the second battery module, to compare the measured second state information with the reference voltage to analyze the same, and to apply a result value of the comparison and analysis to a preset diagnostic level range to diagnose a current state of the second vehicle.

It is to be understood that both the foregoing general description and the following detailed description of the present disclosure are exemplary and explanatory and are intended to provide further explanation of the present disclosure as claimed.

BRIEF DESCRIPTION OF THE DRAWINGS

The accompanying drawings, which are included to provide a further understanding of the present disclosure and are incorporated in and constitute a part of this application, illustrate embodiment(s) of the present disclosure and together with the description serve to explain the principle of the present disclosure. In the drawings.

DETAILED DESCRIPTION

Figure 1:
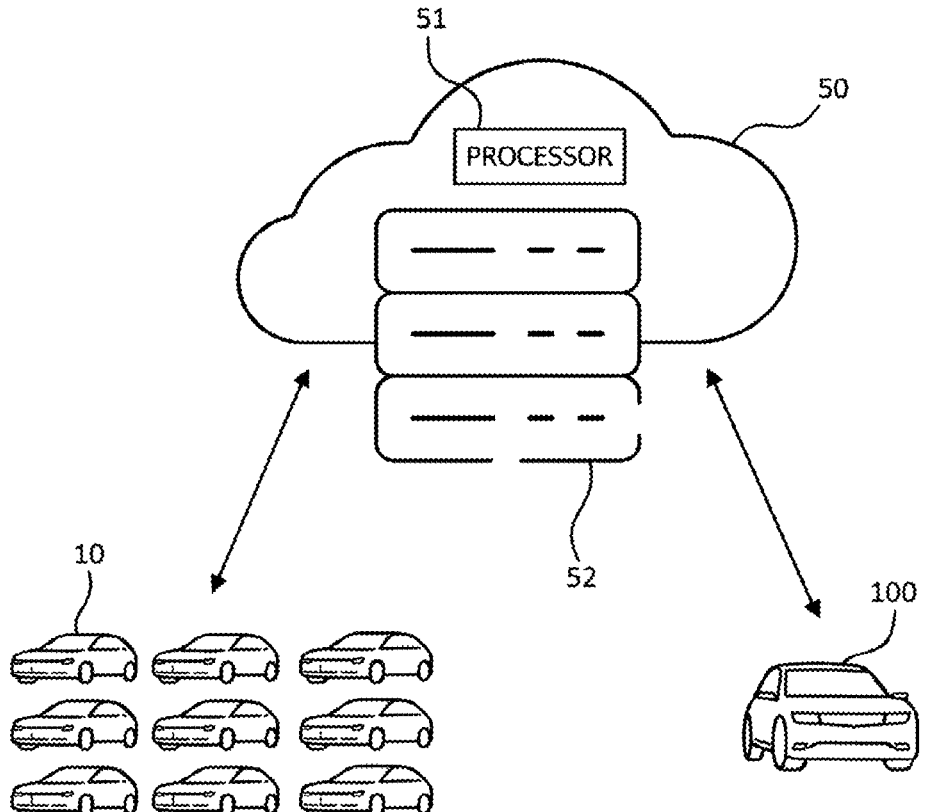
FIG. 1 is a diagram for explaining a big-data-based battery diagnostic system according to an embodiment of the present disclosure.

Exemplary embodiments of the present disclosure will be described below in detail with reference to the accompanying drawings so as to be easily realized by those skilled in the art to which the present disclosure pertains. The present disclosure may, however, be embodied in different forms and should not be construed as being limited to the embodiments set forth herein. In order to clearly illustrate the present disclosure in the drawings, parts irrelevant to the description may be omitted in the drawings, and like reference numerals refer to like elements throughout the specification.

Throughout the specification, it will be understood that when a component is referred to as "comprising/including" any component, it does not exclude other components, but can further comprise/include the other components unless specified otherwise. Throughout the specification, the same reference numerals designate the same constituent elements.

In addition, the unit or control unit included in the name of a hybrid control unit (HCU) or the like is only a term widely used in naming a control unit (controller) for controlling a specific function of the vehicle, and does not mean a generic functional unit. For example, each control unit may include a communication device that communicates with other control units or sensors to control the function it is responsible for, a memory that stores an operating system or logic commands and input/output information, and one or more processors that perform determination, calculation, decision, etc. necessary for controlling the function in charge thereof.

FIG. 1 is a diagram for explaining a big-data-based battery diagnostic system according to an embodiment of the present disclosure.

Referring to FIG. 1, the big-data-based battery diagnostic system according to the embodiment of the present disclosure may include a first vehicle 10, a battery data server 50, and a second vehicle 100.

The first vehicle 10 may have a first battery module (not shown) disposed therein. The first vehicle 10 may measure first state information related to the first battery module while traveling or parking or stopping. The first vehicle 10 may include a communication module (not shown). The first vehicle 10 may transmit the first state information measured by the communication module to the battery data server 50. The first vehicle 10 may consist of a plurality of mass-produced vehicles. The first vehicle 10 may be referred to as a first hybrid vehicle.

The first vehicle 10 may include a parallel type (or transmission mounted electric drive (TMED)) hybrid powertrain in which a first motor (or drive motor), a second motor (or torque motor), and an engine clutch (EC) are mounted between an internal combustion engine (ICE) and a transmission. A detailed description thereof will be given later.

The battery data server 50 may collect the first state information related to the first battery module provided from the first vehicle 10, learn the collected first state information, and set a reference voltage for the first vehicle 10 based on the learned first state information.

The battery data server 50 may include a processor 51 and a memory 52.

The processor 51 may collect the first state information related to the first battery module provided from the first vehicle 10, learn the collected first state information, and set a reference voltage for the first vehicle 10 based on the learned first state information.

The processor 51 may learn diagnostic data provided from the first vehicle 10, update the reference voltage for the first vehicle 10 based on the learned diagnostic data to be an updated reference voltage for the first vehicle 10, and provide the updated reference voltage for the first vehicle 10 to the first vehicle 10 and the second vehicle 100.

The processor 51 may train a neural network using a program stored in the memory 52. The processor 51 may be referred to as an AI processor 51. In particular, the AI processor 51 may train a neural network for recognizing device-related data. Here, the neural network for recognizing device-related data may be designed to simulate a human brain structure on a computer, and may include a plurality of network nodes having weights that simulate neurons of a human neural network. The network modes may transmit and receive data according to the connection relationship therebetween, so as to simulate synaptic activities of the neurons that transmit and receive signals through synapses. Here, the neural network may include a deep learning model developed from the neural network model. In the deep learning model, a plurality of network nodes may transmit and receive data according to the convolutional connection relationship therebetween while being positioned in different layers. Examples of the neural network model include various deep learning techniques such as deep neural networks (DNNs), convolutional deep neural networks (CNNs), recurrent neural networks (RNNs), restricted Boltzmann machine (RBM), deep belief networks (DBNs), and deep Q-networks, which may be applied to fields such as computer vision, speech recognition, natural language processing, and speech/signal processing.

Meanwhile, the processor 51 that performs the function as described above may be a general-purpose processor 51 (e.g., CPU), but alternatively, it may be an AI-specific processor 51 (e.g., GPU) for artificial intelligence learning.

The memory 52 may store various programs and data necessary for the operation of the battery data server 50. The memory 52 may be implemented as a non-volatile memory 52, a volatile memory 52, a flash memory 52, a hard disk drive (HDD), a solid state drive (SSD), or the like. The memory 52 may be accessed by the AI processor 51, and the AI processor 51 may perform reading/writing/modification/deletion/update of data or the like. The memory 52 may store a neural network model (for example, a deep learning model) generated through a learning algorithm for data classification/recognition according to the embodiment of the present disclosure.

The AI processor 51 may include a data learning unit 51c configured to train a neural network for data classification/recognition. A detailed description of the data learning unit 51c will be given later.

The second vehicle 100 may receive the reference voltage from the battery data server 50, and have a second battery module (not shown) disposed therein. The second vehicle 100 may measure second state information related to a second battery module (not shown) while traveling or parking or stopping under the control of a hybrid control unit 240.

The second vehicle 100 may compare the reference voltage provided under the control of the hybrid control unit 240 with the measured second state information to analyze the same, and apply a result value of the comparison and analysis to a preset diagnostic level range to diagnose the current state of the second vehicle 100. The result value of the comparison and analysis may include a fault code and a warning code.

The second vehicle 100 may apply the preset diagnostic level range based on the number of fault codes or the number of warning codes.

The preset diagnostic level range may include an nth diagnostic level to an n+2th diagnostic level having different ranges, where n may be a natural number of 1 or more.

The second vehicle 100 may apply the nth diagnostic level to the n+2th diagnostic level based on the number of fault codes or the number of warning codes under the control of the hybrid control unit 240, and generate diagnostic data on the current state of the second vehicle 100 in response to the applied nth diagnostic level to the n+2th diagnostic level. A detailed description thereof will be given later.

The first vehicle 100 may transmit the generated diagnostic data on the current state of the second vehicle 100 to the battery data server 50. The second vehicle 100 may include a communication module. The second vehicle 100 may receive a reference voltage from the battery data server 50 through the communication module, and may transmit the diagnostic data to the battery data server 50.

The second vehicle 100 may be the same model as the mass-produced first vehicles 10. The second vehicle 100 may be referred to as a second hybrid vehicle.

The second vehicle 100 may notify the driver of the second vehicle 100 of a fault code or a warning code as the diagnostic data in various manners. For example, the second vehicle 100 may notify the driver of a fault code or a warning code, which is the diagnostic data on the second vehicle 100, using a display or a speaker disposed within the vehicle. In this case, the second vehicle 100 may display a detailed description of the fault code or warning code together with a location thereof together so that the driver can easily understand the same.

The second vehicle 100 may prevent a battery event (fire), or the like by analyzing a fault or warning code as the diagnostic data and inducing preliminary diagnosis and preventive maintenance for abnormality of battery cell voltages.

The second vehicle 100 may include a parallel type (or transmission mounted electric drive (TMED)) hybrid powertrain in which a first motor (or drive motor), a second motor (or torque motor), and an engine clutch (EC) are mounted between an internal combustion engine (ICE) and a transmission. A detailed description thereof will be given later.

The above-mentioned first vehicle 10, battery data server 50, and second vehicle 100 according to the embodiment of the present disclosure may transmit/receive data or information through a network.

Examples of the network may include a wired and wireless network such as local area network (LAN), wide area network (WAN), Internet, Intranet, and Extranet, and a mobile network such as cellular, 3G, LTE, 5G, Wi-Fi, ad hoc network, and any suitable communication network, including combinations thereof. For example, the network may include a connection of network elements such as hubs, bridges, routers, switches, and gateways. The network may include one or more connected networks, for example, a multi-network environment, including a public network such as Internet and a private network such as a secure enterprise private network. One or more wired or wireless access networks may allow access to the network.

Figure 2:
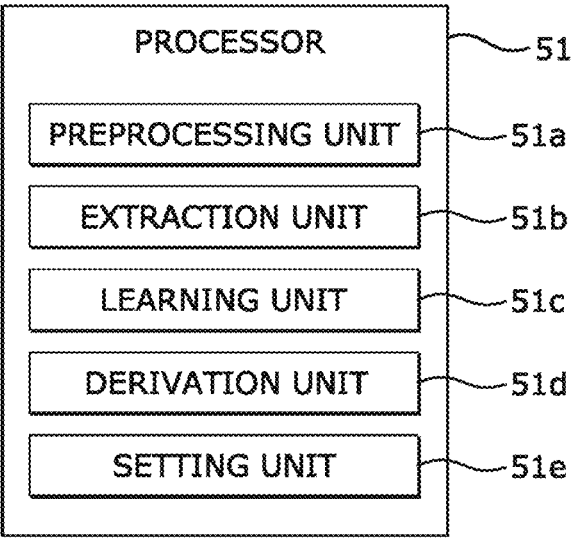
FIG. 2 is a diagram for explaining a battery data server according to the embodiment of the present disclosure.
Figure 3:
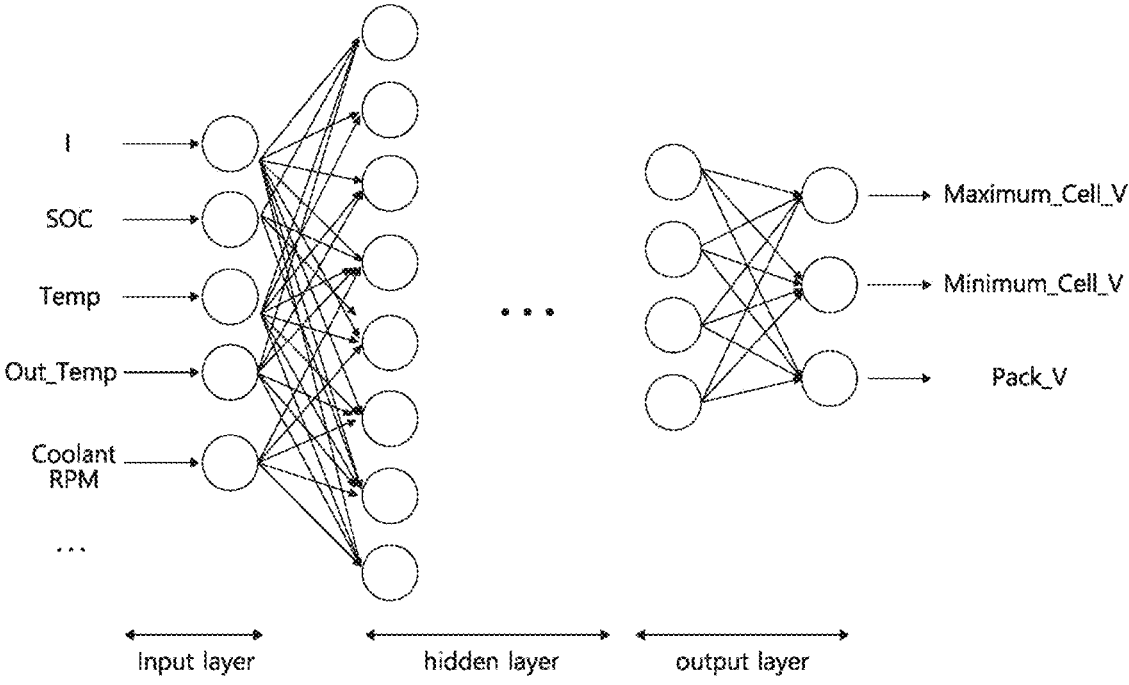
FIG. 3 is a diagram for explaining a multilayer neural network installed in a learning unit according to the embodiment of the present disclosure.

FIG. 2 is a diagram for explaining the battery data server according to the embodiment of the present disclosure. FIG. 3 is a diagram for explaining a multilayer neural network installed in the learning unit 51c according to the embodiment of the present disclosure.

Referring to FIG. 2, the battery data server 50 according to the embodiment of the present disclosure may include a processor 51. The processor 51 may include a preprocessing unit 51a, an extraction unit 51b, a learning unit 51c, a derivation unit 51d, and a setting unit 51e.

The preprocessing unit 51a may preprocess a plurality of pieces of first state information collected through the battery data server 50. The preprocessing unit 51a may receive the plurality of pieces of first state information under the control of the processor 51 and process the plurality of pieces of first state information in a form suitable for the purpose and method of data analysis. The preprocessing unit 51a may separate and remove unnecessary information from the plurality of pieces of first state information and process the same. For example, the preprocessing unit 51a may perform data purification, data conversion, data filtering, data integration, data reduction, etc. by processing the first state information according to the purpose and method of analysis, thereby reducing an error in measurement of the plurality of pieces of first state information and minimizing noise, distortion, and deviation.

The extraction unit 51b may extract a feature value of the first vehicle 10 from the preprocessed first state information. The feature value of the first vehicle 10 may include at least one of a vehicle identification number (VIN) of the first vehicle 10, and SOH/SOC/temperature/coolant temperature/ current load related to the first battery module. For example, the extraction unit 51*b* may extract the vehicle identification number (VIN) of the first vehicle 10 to classify the VIN by country/region through VIN data. The processor 51 may check the first state information for the first battery module that is changed in response to the climate, temperature, altitude, latitude, topography, distance to the sea, and the like that vary by country/region. That is, it is possible to check a limit or an error with respect to the first battery module by extending the spectrum of the first state information for the first battery module.

The learning unit 51*c* may learn based on the extracted feature value of the first vehicle 10. The learning unit 51*c* may be referred to as a data learning unit 51*c*. For example, the data learning unit 51*c* may learn a criterion regarding which learning data to use to determine data classification/recognition and how to classify and recognize data using the learning data. The data learning unit 51*c* may train a deep learning model by acquiring learning data to be used for training and applying the acquired learning data to the deep learning model.

The data learning unit 51*c* may be manufactured in the form of at least one hardware chip and mounted on the battery data server 50. For example, the data learning unit 51*c* may be manufactured in the form of a dedicated hardware chip for artificial intelligence (AI), and may be manufactured as a part of the general-purpose processor 51 (CPU) or the graphics-specific processor 51 (GPU) to be mounted on the battery data server 50.

Alternatively, the data learning unit 51*c* may be implemented as a software module. When the data learning unit 51*c* is implemented as a software module (or a program module including instructions), the software module may be stored in a non-transitory computer-readable medium. In this case, at least one software module may be provided by an operating system (OS).

The learning unit 51*c* may include an artificial neural network. The artificial neural network is classified into a single layer neural network and a multilayer neural network according to the number of layers. The layers may be referred to as a layer.

The single layer neural network is composed of an input layer and an output layer.

As illustrated in FIG. 3, the multilayer neural network is composed of an input layer, one or more hidden layers, and an output layer.

The input layer is a layer that receives external data. The number of neurons in the input layer is the same as the number of input variables. The hidden layers are positioned between the input layer and the output layer, receive a signal from the input layer, extract characteristics, and transmit the same to the output layer. The output layer receives a signal from the hidden layers and outputs an output value based on the received signal. The input signal between the neurons is multiplied by each connection strength (weight) and then summed. If this sum is greater than the threshold of each neuron, the neuron is activated to output the output value acquired through an activation function. For example, SOH/SOC/temperature/coolant temperature/current load, etc. related to the first battery module may be input to the input layer. In the output layer, the maximum voltage, the minimum voltage, and the average voltage of the first battery module, the maximum voltage, the minimum voltage, and the average voltage for each of the plurality of battery cells including the first battery module, the maximum voltage, the minimum voltage, and the average voltage of the first battery pack including the plurality of first battery modules, etc. may be output.

The present disclosure is not limited thereto, and the input layer may include all factors or types of data affecting the battery.

Meanwhile, the deep neural network including the plurality of hidden layers between the input layer and the output layer may be a representative artificial neural network implementing deep learning, which is a type of machine learning.

The learning unit 51*c* may determine the state of the first state information using an LSTM recurrent neural network under the control of the processor 51. The LSTM recurrent neural network is an artificial neural network (ANN) constructed by connecting networks at a reference time point (t) and a next time point (t+1) in the deep learning model for learning data that changes over time, such as time-series data.

That is, the LSTM recurrent neural network may be a neural network trained to estimate the state of the battery module according to the time-series change of the first state information related to the first battery module measured while the first vehicle 10 is traveling.

The learning unit 51*c* may use a convolutional neural network under the control of the processor 51. The convolutional neural network may be a neural network trained to determine the reference voltage of the first vehicle 10 based on the feature value of the first vehicle 10 extracted from the first state information.

The learning unit 51*c* determines the optimized model parameters of the artificial neural network by repeatedly training the artificial neural network using the various learning techniques described above under the control of the processor 51.

In the present disclosure, the artificial neural network whose parameters are determined by training using training data may be referred to as a learning model or a trained model.

In this case, the learning model may be used to infer a result value of new input data rather than training data. The learning unit 51*c* may be configured to receive, classify, store and output information to be used for data mining, data analysis, intelligent decision making, and machine learning algorithms and techniques under the control of the processor 51.

The derivation unit 51*d* may derive a reference voltage for the first vehicle 10 based on the learned feature value of the first vehicle 10. When the first vehicle 10 has at least one feature value, the derivation unit 51*d* may derive at least one reference voltage for the first vehicle 10 in response to the at least one feature value of the first vehicle 10. For example, when the maximum voltage, minimum voltage, average voltage, etc. for each of the first battery cell, the first battery module, and the first battery pack, which are the learned feature values of the first vehicle 10 provided by the learning unit 51*c,* are derived, the derivation unit 51*d* may derive each of those values as a reference voltage for the first vehicle 10.

The setting unit 51*e* may set the derived reference voltage for the first vehicle 10. The setting unit 51*e* may set, as the reference voltage for the first vehicle 10, at least one of the maximum voltage, the minimum voltage, and the average voltage for each of the first battery cell, the first battery module, and the first battery pack, which are derived by the derivation unit 51*d*. The setting unit 51*e* may set one or more reference voltages for the first vehicle 10 in consideration of the state of the first battery or the like.

The structure and control system of the hybrid vehicle that is applicable to the above-mentioned big-data-based battery diagnostic system according to the embodiment of the present disclosure are as follows. The first and second vehicles may be first and second hybrid vehicles. It will be apparent to those skilled in the art that the structure of the vehicle to be described below with reference to FIGS. 4 and 5 may be similarly applied to an electric vehicle (EV), except for a portion related to the internal combustion engine.

Figure 4:
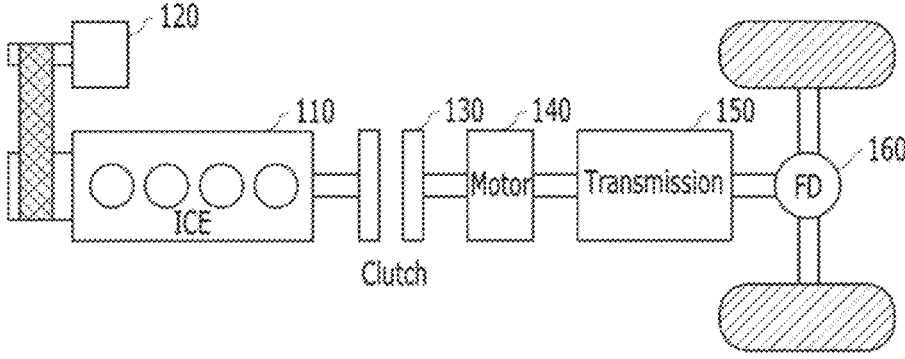
FIG. 4 illustrates an exemplary configuration of a hybrid vehicle that is applicable to embodiments of the present disclosure.

FIG. 4 illustrates an exemplary configuration of a hybrid vehicle that is applicable to embodiments of the present disclosure.

Referring to FIG. 4, the hybrid vehicle according to the embodiments may include a parallel type (or transmission mounted electric (TMED)) hybrid powertrain in which a first motor (or drive motor) 140, a second motor (or torque motor) 180, and an engine clutch (EC) 130 are mounted between an internal combustion engine (ICE) 110 and a transmission 150.

In the vehicle, in general, when a driver depresses an accelerator after starting, the first motor (or drive motor) 140 is driven using the electric power of a battery with the engine clutch 130 opened, and the power of the first motor 140 is transmitted to the transmission 150 and a final drive (FD) 160 to rotate wheels (i.e., EV mode). When a greater driving force is required while the vehicle is gradually accelerated, a starter generator motor 120 may operate to drive the engine 110. The first motor (or the drive motor) 140 may be referred to as a main motor.

Accordingly, when the rotational speed of the engine 110 is substantially equal to that of the first motor 140, the engine clutch 130 is then engaged therewith so that the engine 110 or the engine 110 and the first motor 140 together drive the vehicle (i.e., transition from EV mode to HEV mode). When a preset engine-off condition is satisfied, such as when the vehicle is decelerated, the engine clutch 130 is opened and the engine 110 is stopped (i.e., transition from HEV mode to EV mode). In addition, in the hybrid vehicle, the battery 170 may be charged by converting the driving force of the wheels into electric energy during braking, which is referred to as braking energy regeneration or regenerative braking.

The starter generator motor 120 serves as a starter motor when the engine 110 is started, and operates as a generator when the rotational energy of the engine 110 is recovered after the engine is started or when the engine 110 is turned off. Therefore, the starter generator motor 120 may be referred to as a "hybrid starter generator (HSG)", and in some cases, may also be referred to as an "auxiliary motor".

Figure 5:
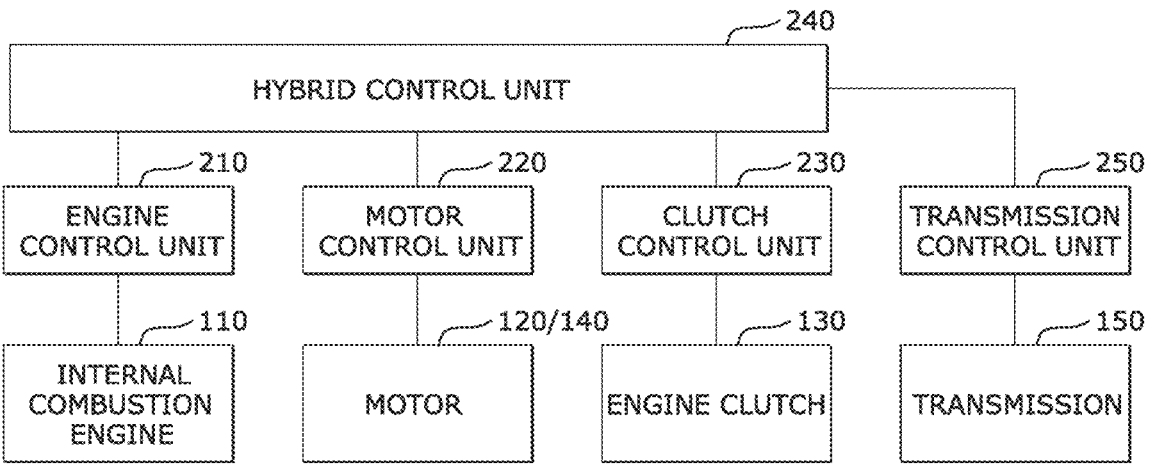
FIG. 5 is a block diagram illustrating an exemplary control system of the hybrid vehicle that is applicable to the embodiments of the present disclosure.

FIG. 5 is a block diagram illustrating an exemplary control system of the hybrid vehicle that is applicable to the embodiments of the present disclosure. The control system illustrated in FIG. 5 may be applied to a vehicle including the powertrain described above with reference to FIG. 4.

Referring to FIG. 5, in the hybrid vehicle that is applicable to the embodiments of the present disclosure, the internal combustion engine 110 may be controlled by an engine control unit 210, the torque of the starter generator motor 120 and the drive motor 140 may be controlled by a motor control unit (MCU) 220, and the engine clutch 130 may be controlled by a clutch control unit 230. Here, the engine control unit 210 is also referred to as an engine management system (EMS). The transmission 150 is controlled by a transmission control unit 250. In some cases, a controller for each of the starter generator motor 120, the drive motor 140, and the torque motor 180 may be provided separately.

Each of the control units may be connected to the hybrid control unit (HCU) 240 that is its superordinate control unit and controls the overall mode transition process, to provide the HCU 240 with information necessary for driving mode change, engine clutch control when shifting gears, and/or engine stop control under the control of the HCU 240, or to operate in response to the control signal from the HCU 240.

For example, the hybrid control unit 240 may control the overall powertrain in driving the vehicle. For example, the hybrid control unit 240 may determine when the engine clutch 130 is released (open). The hybrid control unit 240 may determine the state (lock-up, slip, open, etc.) of the engine clutch 130 and control the timing of stopping the injection of fuel into the engine 110. In order to control engine stop, the hybrid control unit 240 may transmit a torque command for controlling the torque of the starter generator motor 120 to the motor control unit 220 to control the rotational energy of the engine to be recovered.

In addition, the hybrid control unit 240 may compare the provided reference voltage with the measured second state information to analyze the same, and apply a result value of the comparison and analysis to a preset diagnostic level range to diagnose the current state of the second vehicle. The hybrid control unit 240 may apply an nth diagnostic level to an n+2th diagnostic level based on the number of fault codes or warning codes, and generate diagnostic data on the current state of the second vehicle in response to the applied nth diagnostic level to the n+2th diagnostic level.

Of course, it is apparent to those skilled in the art that the above-mentioned connection relationship between the control units and function/classification of each control unit are merely illustrative and are not limited to the names thereof. For example, the hybrid control unit 240 may be implemented such that the function thereof is replaced in any one of the other control units, or is distributed in two or more of the other control units.

Figure 6:
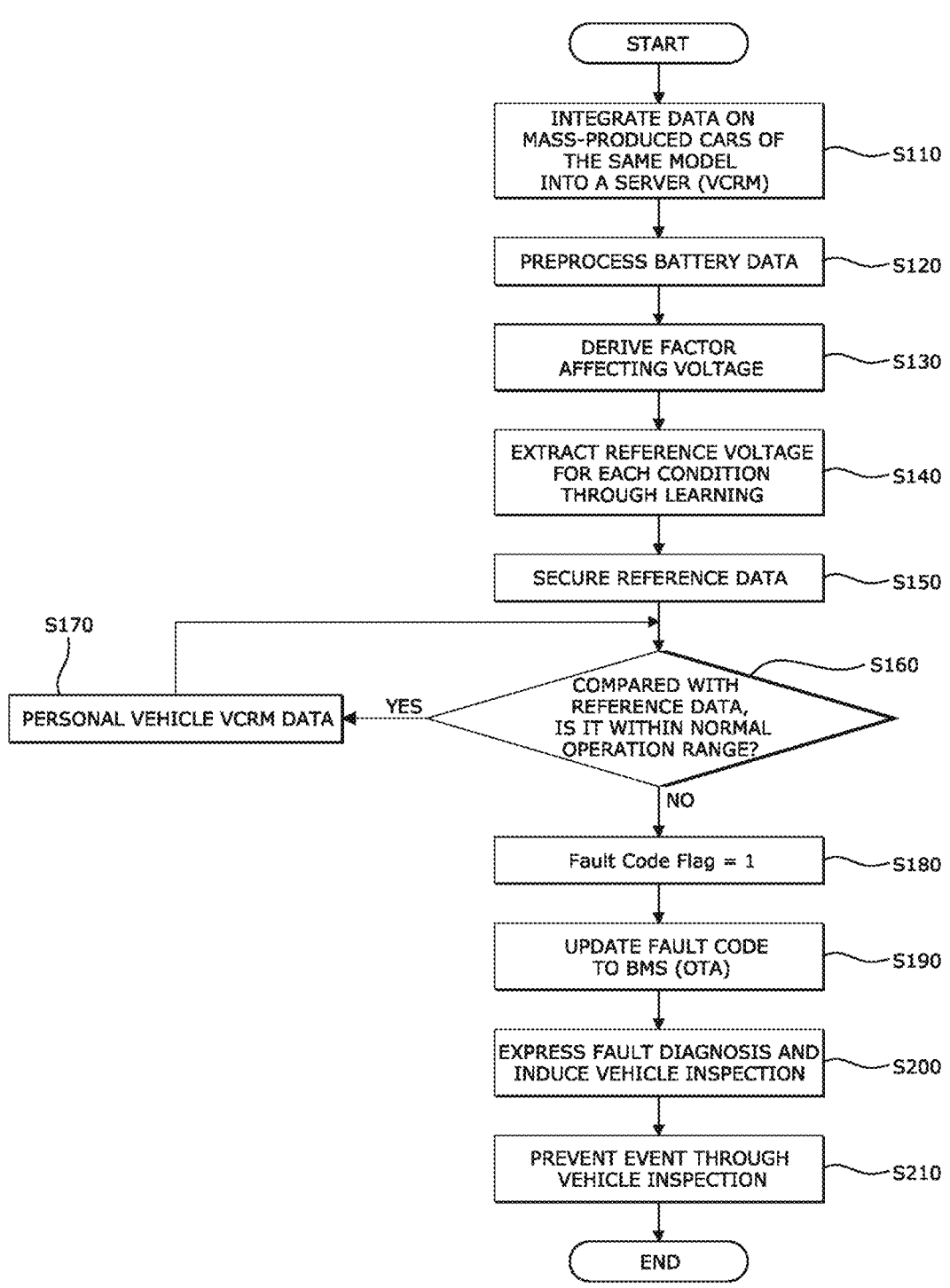
FIG. 6 is a flowchart explaining a method of controlling a big-data-based battery diagnostic system according to an embodiment of the present disclosure.
Figure 7:
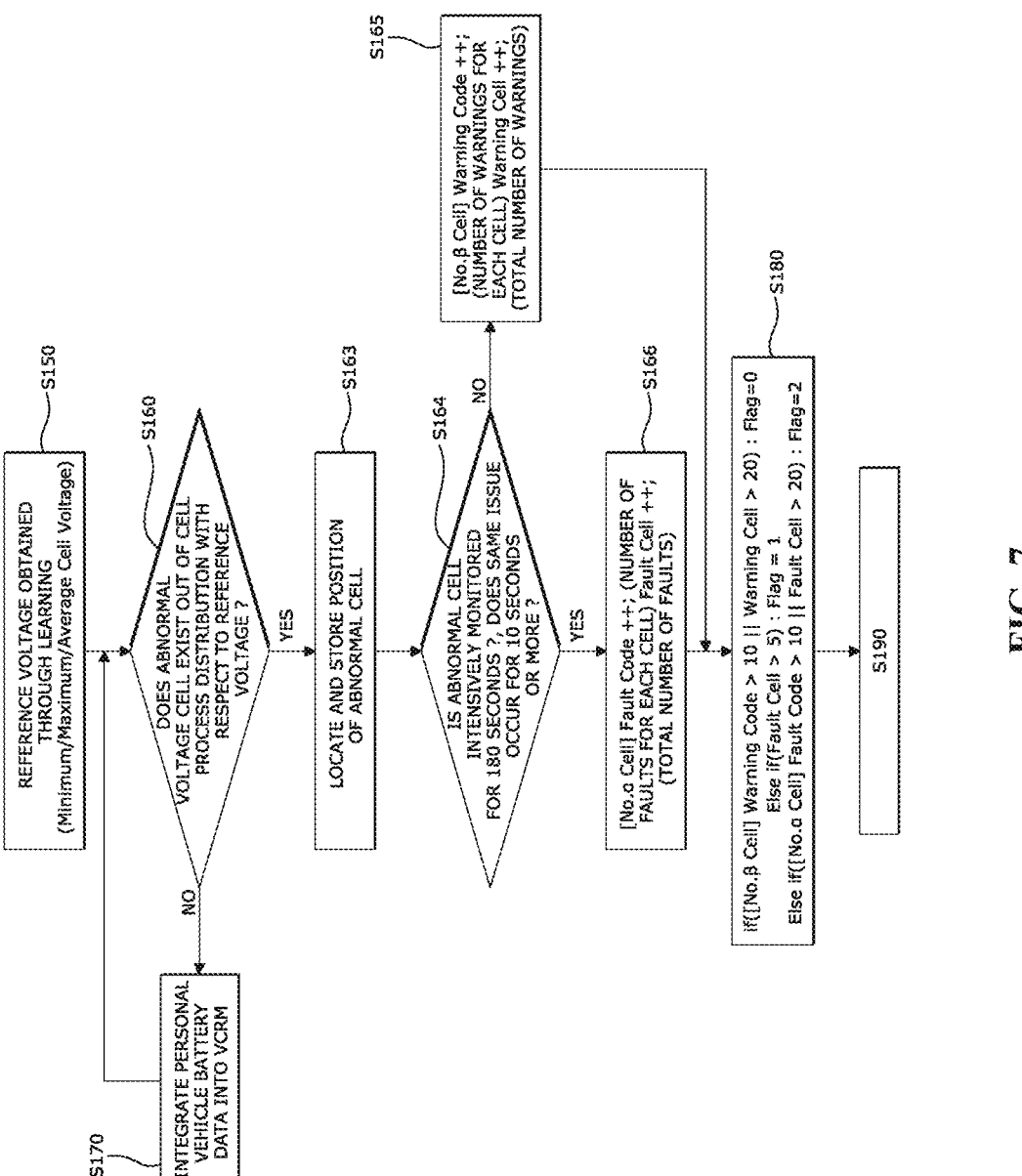
FIG. 7 is another flowchart explaining a method of controlling a big-data-based battery diagnostic system according to an embodiment of the present disclosure.
Figure 8:
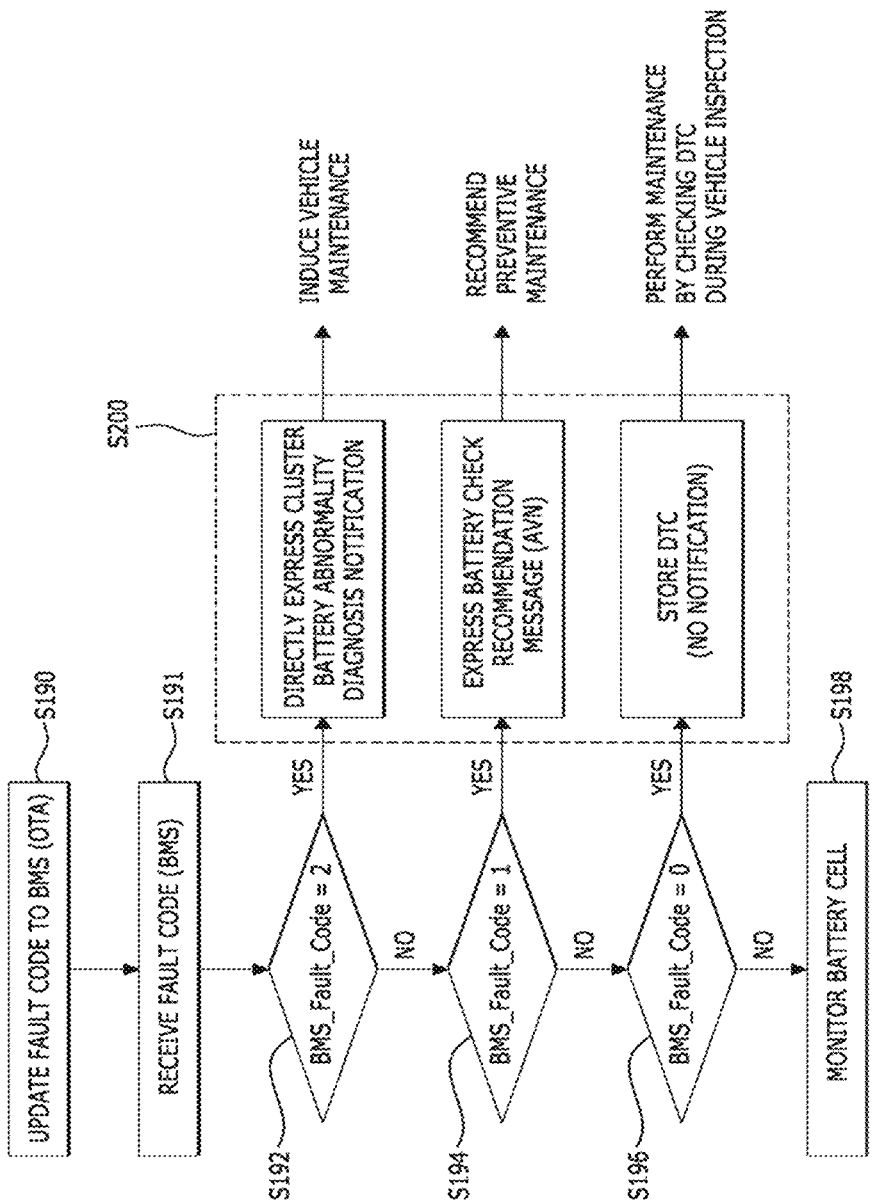
FIG. 8 is another flowchart explaining a method of controlling a big-data-based battery diagnostic system according to an embodiment of the present disclosure.

FIGS. 6 to 8 are flowcharts for explaining a method of controlling a big-data-based battery diagnostic system according to an embodiment of the present disclosure.

Referring FIGS. 6 to 8, the method of controlling a big-data-based battery diagnostic system according to the embodiment of the present disclosure may include a collection step, a setting step, a provision step, a measurement step, and a diagnosis step.

The collecting step may collect first state information related to a first battery module from a first vehicle having the first battery module disposed therein (S110). For example, a battery data server may receive and collect first state information from each of a plurality of first vehicles in real time. The plurality of first vehicles may be mass-produced vehicles of the same model.

The battery data server may be a device capable of processing data related to vehicle customer relationship management (VCRM). For example, the VCRM may be a processor that collects first state information provided by a first vehicle that has already been sold and provides a new customer service through the same. The battery data server may receive VCRM-related data from the first or second vehicle to collect big data. For example, the VCRM-related data may include first state information, second state information, diagnostic data, and the like.

The setting step may learn the collected first state information and set a reference voltage for the first vehicle based on the learned first state information (S120 to S150).

The setting step may include a preprocessing step, an extraction step, a learning step, a derivation step, and a securement step.

The preprocessing step may preprocess a plurality of pieces of first state information collected through the battery data server (S120). That is, the battery data may be preprocessed.

The extraction step may extract a feature value of the first vehicle from the preprocessed first state information (S130). That is, at least one factor affecting the voltage of the battery may be derived or extracted from the first state information.

The learning step and the derivation step may learn based on the extracted feature value of the first vehicle, and derive a reference voltage for the first vehicle based on the learned feature value of the first vehicle (S140). When the first vehicle has at least one feature value, the derivation step may derive at least one reference voltage for the first vehicle in response to the at least one feature value of the first vehicle. That is, at least one reference voltage may be derived or extracted for each condition through learning.

The securement step may secure the derived reference voltage for the first vehicle (S150). That is, data on at least one reference voltage may be secured and set in some cases.

The battery data server may provide at least one reference voltage to the second vehicle.

The diagnosis step may measure second state information related to a second battery module through the second vehicle, compare the measured second state information with the reference voltage to analyze the same, and apply a result value of the comparison and analysis to a preset diagnostic level range to diagnose the current state of the second vehicle (S160).

When the result value of the comparison and analysis does not deviate from an error range of the reference voltage, the diagnosis step may determine that all battery cells disposed in the second battery module are normal. That is, when the result value of the comparison and analysis is included in the reference voltage, it may be determined that the second vehicle is normal and the second vehicle may update the content of the diagnostic data by itself (S170).

When the result value of the comparison and analysis deviates from the error range of the reference voltage, the diagnosis step may determine that an abnormal battery cell exists among the plurality of first battery cells disposed in the second battery module. That is, the hybrid control unit of the second vehicle may determine that an abnormal voltage cell exists out of the cell process distribution with respect to the reference voltage.

Accordingly, when the result value of the comparison and analysis deviates from the reference voltage, the diagnosis step may determine that it is abnormal, and may identify and store a position of an abnormal battery cell among the plurality of second battery cells (S163).

Then, the diagnosis step may intensively monitor the identified abnormal battery cell for a predetermined time, and when the same issue occurs for a preset time or more (S164), may determine that an abnormal battery cell exist, thereby generating fault codes and counting them (S166). Here, the predetermined time may be 160 seconds to 200 seconds, and the preset time may be 8 to 12 seconds.

In contrast, the diagnosis step may intensively monitor the identified abnormal battery cell for a predetermined time, and when the same issue does not occur for a preset time or more, may generate warning codes and count them (S165).

The diagnosis step may count and calculate the fault codes for each battery cell under the control of the hybrid control unit, and sum and calculate all of them. The second battery pack may include a plurality of second battery modules, and each of the second battery modules may include a plurality of second battery cells. For example, if it is assumed that the second battery pack includes three second battery modules and each of the second battery modules includes three second battery cells, the number of fault codes generated in the (1,3)th battery cell may be 3, the number of fault codes generated in the (2,2)th battery cell may be 4, the number of fault codes generated in the (3,3)th battery cell may be 4, and the total number of fault codes generated in the second battery pack may be 10.

The second battery module may also include a plurality of second battery cells. For example, if it is assumed that the second battery pack includes three second battery modules and each of the second battery modules includes three second battery cells, the number of warning codes generated in the (1,3)th battery cell may be 5, the number of fault codes generated in the (2,2)th battery cell may be 10, the number of fault codes generated in the (3,3)th battery cell may be 3, and the total number of fault codes generated in the second battery pack may be 18.

Then, the diagnosis step may set a flag in response to the result value of the comparison and analysis (S180). For example, the second vehicle may set a flag based on the number of fault codes or warning codes under the control of the hybrid control unit. Here, the flag may be referred to as a diagnostic level. The range of the preset flag or the range of the preset diagnostic level may include an nth diagnostic level (or flag 0) to an n+2th diagnostic level (or flag 2) having different ranges, where n may be a natural number of 1 or more.

The diagnosis step may apply or set the nth diagnostic level (or flag 0) to the n+2th diagnostic level (or flag 2) based on the number of fault codes or warning codes under the control of the hybrid control unit. For example, under the control of the hybrid control unit, the diagnosis step may set flag 0 (or first diagnostic level) when the number of warning codes is 10 to 20, set flag 1 (or second diagnostic level) when the number of fault codes is 5 or less, and set flag 2 (or third diagnostic level) when the number of fault codes is 5 to 10.

The flag may be a bit in which the diagnostic state of the vehicle battery is predefined according to the number of fault codes or the number of warning codes. Accordingly, the diagnosis step may quickly and accurately check the diagnosis state of the second vehicle by presetting a flag according to the number of fault codes or warning codes under the control of the hybrid control unit.

Then, the diagnosis step may apply or update the set flag to a battery management system (BMS) (S190). The BMS may receive the flag set using over the air programming (OTA) and update the content thereof. Here, the over the air programming (OTA) may be a method for wirelessly distributing new software, firmware, settings, and encryption key updates, including set flags, to devices such as smart devices and battery management systems (BMSs).

When a warning signal or a fault signal is received under the control of the battery management system (BMS) (S191), the diagnosis step may apply the same in response to the updated flag (S192 to S196). For example, the updated flag may be referred to as a preset diagnostic level range.

The diagnosis step may generate diagnostic data on the current state of the second vehicle (S200) in response to the applied nth diagnostic level (or flag 0) to the n+2th diagnostic level (or flag 2) (S192 to S196).

For example, when it is determined that the received fault signal or warning signal is flag 2 (S192), the diagnosis step may generate diagnostic data 2 corresponding thereto (S200). In this case, the diagnostic data 2 may include a content that directly expresses a cluster battery abnormality diagnosis notification. This may induce vehicle maintenance.

In addition, when it is determined that the received fault signal or warning signal is flag 1 (S194), the diagnosis step may generate diagnostic data 1 corresponding thereto (S200). In this case, the diagnostic data 1 may include a content that expresses a battery check recommendation message. This may recommend preventive maintenance.

In addition, when it is determined unit of the received fault signal or warning signal is flag 0 (S196), the diagnosis step may generate diagnostic data 0 corresponding thereto (S200). In this case, the diagnostic data 0 may store DTC (or not express notification). This may perform maintenance by checking DTC during vehicle inspection.

Then, the diagnosis step may continue to monitor the battery cell of the second vehicle (S198).

As described above, the present disclosure can diagnose the current state of the second vehicle by application of the preset diagnostic level range and provide diagnostic data on the diagnosed current state of the second vehicle to the battery data server. That is, the battery data server may receive diagnostic data from the second vehicle to collect big data. The diagnostic data may be VCRM-related data. A detailed description thereof will be omitted since it has been sufficiently given above.

As described above, the present disclosure can prevent an event through vehicle inspection by setting diagnostic data using a preset diagnostic level range in advance (S210).

In addition, the present disclosure can learn the diagnostic data, update the reference voltage for the first vehicle to be an updated reference voltage for the first vehicle based on the learned diagnostic data, and provide the updated reference voltage for the first vehicle to the first and second vehicles. A detailed description thereof will be omitted since it has been sufficiently given above.

As described above, the present disclosure can compare the vehicle data of the second vehicle (current vehicle) with the reference voltage value obtained through the data of the multiple first vehicles (mass-produced vehicles) under the same conditions, divide and store at least one fault code flag when the battery cell at a specific location is continuously observed in a low (Minimum_V) or high (Maximum_V) state compared to the reference voltage, and update the corresponding Fault Flag to the BMS using OTA, thereby expressing the same to the driver or inducing vehicle inspection.

Accordingly, the present disclosure can maximize consistency of battery safety diagnosis for field issues by utilizing big data of actual mass-produced vehicles.

The present disclosure described above can be implemented as computer-readable code on media in which programs are recorded. Computer-readable media include all types of recording devices to store data readable by computer systems. Examples of the computer-readable media include a hard disk drive (HDD), a solid state drive (SSD), a silicon disk drive (SDD), ROM, RAM, CD-ROM, a magnetic tape, a floppy disk, an optical data storage, etc.

As is apparent from the above description, according to the big-data-based battery diagnostic system and the control method therefor of the present disclosure, it is possible to maximize consistency of safety diagnosis of battery cells by learning big data from hundreds to tens of thousands of mass-produced vehicles to estimate how much the current vehicle deviates from its normal state compared to the reference that is set through tens of thousands of other vehicles.

In addition, according to the big-data-based battery diagnostic system and the control method therefor of the present disclosure, it is possible to perform battery safety diagnosis to be customized according to the condition of each vehicle by utilizing big data collected from mass-produced vehicles.

The present disclosure is not limited to the above-mentioned effects, and other effects of the present disclosure can be clearly understood by those skilled in the art to which the present disclosure pertains from the above description.

The present disclosure should be construed not as restrictive but merely as illustrative in all respects. It is intended that the present disclosure cover the modifications and variations of the present disclosure provided they come within the scope of the appended claims and their equivalents.

What is claimed is:

1. A method of controlling a big-data-based battery diagnostic system having a battery data server, the method comprising:
   receiving, by the battery data server, first state information related to a first battery module from a first vehicle in which the first battery module used as at least one power source is disposed;
   learning, by the battery data server, the first state information through an artificial neural network based on at least one factor affecting the voltage of the battery;
   deriving, by the battery data server, a reference voltage that serves as a criterion for safety diagnosis of battery cells for the first vehicle based on the learned first state information;
   transmitting, by the battery data server, the reference voltage to a second vehicle in which the second battery module used as a power source is disposed;
   measuring, by the second vehicle, second state information related to the second battery module;
   determining, by the second vehicle, whether at least one abnormal battery cell exists in the second battery module by comparing second state information related to the second battery module with the reference voltage related to the first battery module thereby determining whether the battery state of the second vehicle is in an abnormal state relative to that of the first vehicle;
   determining, by the second vehicle, a diagnostic level among a plurality of diagnostic levels based on a number of abnormal cells and a number of cells that remain in an abnormal state for a preset time, when at least one abnormal battery cell of the second battery module is determined to exist; and
   inducing, by the second vehicle, a preliminary diagnosis or performing preventive maintenance, in accordance with the determined diagnostic level,
   wherein deriving the reference voltage for the first vehicle includes setting, as the reference voltage, at least one of a maximum voltage, a minimum voltage, or an average voltage for each of a first battery cell, the first battery module, and a first battery pack.

2. The method according to claim 1, further comprising:
   transmitting, by the second vehicle, a result of determination to the battery data server;
   learning, by the battery data server, the result through the artificial neural network, and updating, by the battery data server, the reference voltage for the first vehicle to be an updated reference voltage for the first vehicle based on the learned diagnostic data; and transmitting, by the battery data server, the updated reference voltage for the first vehicle to the first and second vehicles.

3. The method according to claim 2, wherein the deriving a reference voltage for the first vehicle comprises:

preprocessing a plurality of first state information in a form suitable for the purpose and method of data analysis;

extracting the at least one factor affecting the voltage of the battery as a feature value of the first vehicle from the preprocessed first state information;

learning based on the extracted feature value of the first vehicle through artificial neural network; and deriving the reference voltage for the first vehicle based on the learned feature value of the first vehicle.

4. The method according to claim 3, wherein when the first vehicle has at least one feature value, the deriving the reference voltage for the first vehicle comprises deriving at least one reference voltage for the first vehicle in response to the at least one feature value of the first vehicle.

5. The method according to claim 4, wherein the feature value of the first vehicle comprises at least one of a vehicle identification number (VIN) of the first vehicle, and SOH/SOC/temperature/coolant temperature/current load related to the first battery module.

6. The method according to claim 3, wherein the second vehicle is the same model as a plurality of mass-produced first vehicles.

7. The method according to claim 1, wherein the determining further comprising:

monitoring, when at least one abnormal battery cell exists, the abnormal battery cell for a predetermined time;

generating and counting a fault code when a voltage of the abnormal battery cell deviates from the reference voltage for a preset time or more;

generating and counting a warning code when a voltage of the abnormal battery cell does not deviate from the reference voltage for a preset time or more;

determining one of preset levels based on a number of the fault code or the warning code; and generating a battery state data on the current state of the second vehicle in response to the determined preset level.

8. The method according to claim 7, wherein:

each of the preset levels is a bit in which a battery state predefined according to the number of fault codes or the number of warning codes.

9. The method according to claim 8, comprising notifying a driver of the second vehicle according to the generated battery state data with the fault code or the warning code using a display or a speaker disposed within the second vehicle.

10. A non-transitory computer-readable medium containing a program for executing the method of controlling a big-data-based battery diagnostic system according to claim 1.

11. A battery diagnostic system based on big data, comprising:

a first vehicle in which the first battery module used as at least one power source is disposed;

a battery data server having a processor configured to:

receive first state information related to the first battery module from the first vehicle;

learn the collected first state information through an artificial neural network based on at least one factor affecting the voltage of the battery; and derive a reference voltage that serves as a criterion for safety diagnosis of battery cells for the first vehicle based on the learned first state information; and a second vehicle in which the second battery module used as a power source is disposed, wherein the second vehicle is configured to;

receive the reference voltage from the battery data server; and measuring second state information related to the second battery module;

determine whether an abnormal battery cell exists in the second battery module by comparing second state information related to the second battery module with the reference voltage related to the first battery module thereby determining whether the battery state of the second vehicle is in an abnormal state relative to that of the first vehicle;

determine a diagnostic level among a plurality of diagnostic levels based on a number of abnormal cells and a number of cells that remain in an abnormal state for a preset time, when at least one abnormal battery cell of the second battery module is determined to exist; and induce a preliminary diagnosis or perform preventive maintenance in accordance with the determined diagnostic level, wherein the battery data server sets, as the reference voltage, at least one of the maximum voltage, the minimum voltage, or the average voltage for each of a first battery cell, the first battery module, and a first battery pack.

12. The battery diagnostic system according to claim 11, wherein:

the second vehicle receive a result of determination from the battery data server; and the processor is configured to learn the result through artificial neural network update the reference voltage for the first vehicle to be an updated reference voltage for the first vehicle based on the learned diagnostic data, and transmit the updated reference voltage for the first vehicle to the first and second vehicles.

13. The battery diagnostic system according to claim 12, wherein the processor comprises:

a preprocessing unit configured to preprocess a plurality of first state information in a form suitable for the purpose and method of data analysis;

an extraction unit configured to extract the at least one factor affecting the voltage of the battery as a feature value of the first vehicle from the preprocessed first state information;

a learning unit configured to learn based on the extracted feature value of the first vehicle through the artificial neural network; and a derivation unit configured to derive the reference voltage for the first vehicle based on the learned feature value of the first vehicle.

14. The battery diagnostic system according to claim 13, wherein when the first vehicle has at least one feature value, the derivation unit derives at least one reference voltage for the first vehicle in response to the at least one feature value of the first vehicle.

15. The battery diagnostic system according to claim 14, wherein the feature value of the first vehicle comprises at least one of a vehicle identification number (VIN) of the first vehicle, and SOH/SOC/temperature/coolant temperature/current load related to the first battery module.

16. The battery diagnostic system according to claim 13, wherein the second vehicle is the same model as a plurality of mass-produced first vehicles.

17. The battery diagnostic system according to claim 11, wherein when at least one abnormal battery cell exists, the second vehicle further configured to:

monitor the abnormal battery cell for a predetermined time;

generate and count a fault code when a voltage of the abnormal battery cell deviates from the reference voltage for a preset time or more;

generate and count a warning code when a voltage of the abnormal battery cell does not deviate from the reference voltage for a preset time or more;

determine one of preset levels based on a number of the fault code or the warning code; and generating a battery state data on the current state of the second vehicle in response to the determined preset level.

18. The battery diagnostic system according to claim 17, wherein:

each of the preset levels is a bit in which a battery state predefined according to the number of fault codes or the number of warning codes.

19. The battery diagnostic system according to claim 18, wherein the second vehicle is configured to notify a driver of the second vehicle according to the generated battery state data.

* * * * *